(12) United States Patent
Whitby-Strevens et al.

(10) Patent No.: US 8,607,117 B2
(45) Date of Patent: Dec. 10, 2013

(54) SYMBOL ENCODING FOR TOLERANCE TO SINGLE BYTE ERRORS

(71) Applicant: Apple Inc., Cupertino, CA (US)

(72) Inventors: Colin Whitby-Strevens, Ben Lomond, CA (US); Jerrold Von Hauck, Windermere, FL (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/685,586

(22) Filed: Nov. 26, 2012

(65) Prior Publication Data

US 2013/0151910 A1 Jun. 13, 2013

Related U.S. Application Data

(60) Division of application No. 13/175,372, filed on Jul. 1, 2011, now Pat. No. 8,321,748, which is a division of application No. 12/869,600, filed on Aug. 26, 2010, now Pat. No. 7,975,201, which is a continuation of application No. 10/735,260, filed on Dec. 11, 2003, now Pat. No. 7,788,567.

(60) Provisional application No. 60/523,525, filed on Nov. 18, 2003.

(51) Int. Cl.
*H03M 13/00* (2006.01)

(52) U.S. Cl.
USPC ............................. 714/752; 714/786; 714/799

(58) Field of Classification Search
USPC ......................................... 714/752, 786, 799
See application file for complete search history.

(56) References Cited

U.S. PATENT DOCUMENTS

| | | | |
|---|---|---|---|
| 4,156,798 | A | 5/1979 | Doelz |
| 4,194,113 | A | 3/1980 | Fulks et al. |
| 4,726,029 | A | 2/1988 | Motley et al. |
| 5,014,262 | A | 5/1991 | Harshavardhana |
| 5,274,631 | A | 12/1993 | Bhardwaj |
| 5,321,812 | A | 6/1994 | Benedict et al. |
| 5,343,461 | A | 8/1994 | Barton et al. |
| 5,394,556 | A | 2/1995 | Oprescu |
| 5,406,643 | A | 4/1995 | Burke et al. |

(Continued)

FOREIGN PATENT DOCUMENTS

| | | |
|---|---|---|
| EP | 1 085 706 | 3/2001 |
| EP | 1 085 706 | 10/2002 |

OTHER PUBLICATIONS

Bregni et al., Jitter Testing Technique and Results at VC-4 Desynchronizer Output of SDH Equipment, IEEE International Conference on Communications, vol. 3. pp. 1407-1410, May 12, 1994.

(Continued)

*Primary Examiner* — Esaw Abraham
(74) *Attorney, Agent, or Firm* — Gazdzinski & Associates, PC

(57) ABSTRACT

The present invention provides a method that protects symbol types by characterizing symbols as one of two types—DATA or NON_DATA, generating a symbol characterization bit, placing the symbol characterization bit at both ends of the symbol, and transmitting the symbol with the symbol characterization bits at both ends. Thus, a single byte error may affect a type bit in two consecutive symbols, and will affect one or the other of the type bits in a single symbol, but cannot affect both type bits in a single symbol.

21 Claims, 7 Drawing Sheets

(56) References Cited

U.S. PATENT DOCUMENTS

| | | | |
|---|---|---|---|
| 5,425,038 A | 6/1995 | Chen | |
| 5,452,330 A | 9/1995 | Goldstein | |
| 5,490,253 A | 2/1996 | Laha et al. | |
| 5,495,481 A | 2/1996 | Duckwall | |
| 5,502,728 A * | 3/1996 | Smith, III | 714/5.11 |
| 5,524,254 A | 6/1996 | Morgan et al. | |
| 5,539,390 A | 7/1996 | Nagano et al. | |
| 5,541,670 A | 7/1996 | Hanai | |
| 5,568,487 A | 10/1996 | Sitbon | |
| 5,568,641 A | 10/1996 | Nelson | |
| 5,583,922 A | 12/1996 | Davis et al. | |
| 5,621,659 A | 4/1997 | Matsumoto et al. | |
| 5,630,173 A | 5/1997 | Oprescu | |
| 5,632,016 A | 5/1997 | Hoch et al. | |
| 5,640,595 A | 6/1997 | Baugher et al. | |
| 5,642,515 A | 6/1997 | Jones et al. | |
| 5,654,657 A | 8/1997 | Pearce | |
| 5,654,702 A | 8/1997 | Ran | |
| 5,684,715 A | 11/1997 | Palmer | |
| 5,701,476 A | 12/1997 | Fenger | |
| 5,701,492 A | 12/1997 | Wadsworth et al. | |
| 5,706,278 A | 1/1998 | Robillard et al. | |
| 5,712,834 A | 1/1998 | Nagano et al. | |
| 5,719,862 A | 2/1998 | Lee et al. | |
| 5,734,341 A | 3/1998 | Walker | |
| 5,754,765 A | 5/1998 | Danneels et al. | |
| 5,764,930 A | 6/1998 | Staats | |
| 5,784,648 A | 7/1998 | Duckwall | |
| 5,802,048 A | 9/1998 | Duckwall | |
| 5,802,057 A | 9/1998 | Duckwall et al. | |
| 5,802,365 A | 9/1998 | Kathail et al. | |
| 5,805,073 A | 9/1998 | Nagano et al. | |
| 5,805,087 A | 9/1998 | Walker | |
| 5,809,331 A | 9/1998 | Staats et al. | |
| 5,826,027 A | 10/1998 | Pedersen et al. | |
| 5,832,298 A | 11/1998 | Sanchez et al. | |
| 5,835,761 A | 11/1998 | Ishii et al. | |
| 5,845,152 A | 12/1998 | Anderson et al. | |
| 5,867,730 A | 2/1999 | Leyda | |
| 5,875,210 A | 2/1999 | Brief et al. | |
| 5,875,301 A | 2/1999 | Duckwall et al. | |
| 5,923,663 A | 7/1999 | Bontemps et al. | |
| 5,930,480 A | 7/1999 | Staats | |
| 5,935,208 A | 8/1999 | Duckwall et al. | |
| 5,938,764 A | 8/1999 | Klein | |
| 5,940,600 A | 8/1999 | Staats et al. | |
| 5,944,798 A | 8/1999 | McCarty et al. | |
| 5,963,598 A | 10/1999 | Shukhman et al. | |
| 5,968,152 A | 10/1999 | Staats | |
| 5,970,052 A | 10/1999 | Lo et al. | |
| 5,987,605 A | 11/1999 | Hill et al. | |
| 5,991,842 A | 11/1999 | Takayama | |
| 6,032,202 A | 2/2000 | Lea et al. | |
| 6,032,261 A | 2/2000 | Hulyalkar | |
| 6,038,234 A | 3/2000 | LaFollette et al. | |
| 6,038,625 A | 3/2000 | Ogino et al. | |
| 6,052,812 A | 4/2000 | Chen et al. | |
| 6,070,187 A | 5/2000 | Subramaniam et al. | |
| 6,073,206 A | 6/2000 | Piwonka et al. | |
| 6,091,726 A | 7/2000 | Crivellari et al. | |
| 6,115,764 A | 9/2000 | Chisholm et al. | |
| 6,122,248 A | 9/2000 | Murakoshi et al. | |
| 6,131,129 A | 10/2000 | Ludtke et al. | |
| 6,131,134 A | 10/2000 | Huang et al. | |
| 6,131,163 A | 10/2000 | Wiegel | |
| 6,133,938 A | 10/2000 | James | |
| 6,138,196 A | 10/2000 | Takayama et al. | |
| 6,141,702 A | 10/2000 | Ludtke et al. | |
| 6,141,767 A | 10/2000 | Hu et al. | |
| 6,145,018 A | 11/2000 | LaFollette et al. | |
| 6,157,972 A | 12/2000 | Newman et al. | |
| 6,160,796 A | 12/2000 | Zou | |
| 6,167,532 A | 12/2000 | Wisecup | |
| 6,173,327 B1 | 1/2001 | De Borst et al. | |
| 6,192,189 B1 | 2/2001 | Fujinami et al. | |
| 6,199,119 B1 | 3/2001 | Duckwall et al. | |
| 6,202,210 B1 | 3/2001 | Ludtke | |
| 6,212,171 B1 | 4/2001 | LaFollette et al. | |
| 6,212,633 B1 | 4/2001 | Levy et al. | |
| 6,219,697 B1 | 4/2001 | Lawande et al. | |
| 6,233,615 B1 | 5/2001 | Van Loo | |
| 6,233,624 B1 | 5/2001 | Hyder et al. | |
| 6,243,778 B1 | 6/2001 | Fung et al. | |
| 6,247,063 B1 | 6/2001 | Ichimi et al. | |
| 6,247,083 B1 | 6/2001 | Hake et al. | |
| 6,253,114 B1 | 6/2001 | Takihara | |
| 6,253,255 B1 | 6/2001 | Hyder et al. | |
| 6,256,059 B1 | 7/2001 | Fichtner | |
| 6,260,063 B1 | 7/2001 | Ludtke et al. | |
| 6,266,334 B1 | 7/2001 | Duckwall | |
| 6,266,344 B1 | 7/2001 | Fujimori et al. | |
| 6,266,701 B1 | 7/2001 | Sridhar et al. | |
| 6,275,889 B1 | 8/2001 | Saito | |
| 6,282,597 B1 | 8/2001 | Kawamura | |
| 6,292,840 B1 | 9/2001 | Blomfield-Brown et al. | |
| 6,295,479 B1 | 9/2001 | Shima et al. | |
| 6,301,681 B1 | 10/2001 | Chen et al. | |
| 6,308,222 B1 | 10/2001 | Krueger et al. | |
| 6,311,228 B1 | 10/2001 | Ray | |
| 6,314,461 B2 | 11/2001 | Duckwall et al. | |
| 6,330,972 B1 | 12/2001 | Wiklof et al. | |
| 6,343,321 B2 | 1/2002 | Patki et al. | |
| 6,345,315 B1 | 2/2002 | Mishra | |
| 6,347,362 B1 | 2/2002 | Schoinas et al. | |
| 6,353,868 B1 | 3/2002 | Takayama et al. | |
| 6,356,558 B1 | 3/2002 | Hauck et al. | |
| 6,363,085 B1 | 3/2002 | Samuels | |
| 6,373,821 B2 | 4/2002 | Staats | |
| 6,385,679 B1 | 5/2002 | Duckwall et al. | |
| 6,405,247 B1 | 6/2002 | Lawande et al. | |
| 6,411,628 B1 | 6/2002 | Hauck et al. | |
| 6,425,019 B1 | 7/2002 | Tateyama et al. | |
| 6,426,962 B1 | 7/2002 | Cabezas et al. | |
| 6,446,142 B1 | 9/2002 | Shima et al. | |
| 6,452,975 B1 | 9/2002 | Hannah | |
| 6,457,086 B1 | 9/2002 | Duckwall | |
| 6,460,157 B1 | 10/2002 | Chen et al. | |
| 6,463,563 B1 | 10/2002 | Chen et al. | |
| 6,466,982 B1 | 10/2002 | Ruberg | |
| 6,496,862 B1 | 12/2002 | Akatsu et al. | |
| 6,513,085 B1 | 1/2003 | Gugel et al. | |
| 6,519,657 B1 | 2/2003 | Stone et al. | |
| 6,519,736 B1 | 2/2003 | Chen et al. | |
| 6,529,522 B1 | 3/2003 | Ito et al. | |
| 6,574,588 B1 | 6/2003 | Shapiro et al. | |
| 6,574,731 B1 * | 6/2003 | Coles et al. | 713/168 |
| 6,587,904 B1 | 7/2003 | Hauck et al. | |
| 6,591,300 B1 | 7/2003 | Yurkovic | |
| 6,606,320 B1 | 8/2003 | Nomura et al. | |
| 6,615,387 B1 | 9/2003 | Williamson et al. | |
| 6,618,750 B1 | 9/2003 | Staats | |
| 6,618,785 B1 | 9/2003 | Whitby-Streves | |
| 6,624,770 B1 * | 9/2003 | Tsai et al. | 341/102 |
| 6,628,607 B1 | 9/2003 | Hauck et al. | |
| 6,636,914 B1 | 10/2003 | Johas Teener | |
| 6,643,714 B1 | 11/2003 | Chrysanthakopoulos | |
| 6,671,768 B1 | 12/2003 | Brown | |
| 6,842,126 B1 * | 1/2005 | Tsai et al. | 341/102 |
| 7,076,724 B2 | 7/2006 | Cole et al. | |
| 7,080,295 B2 | 7/2006 | Peeters et al. | |
| 7,143,013 B2 | 11/2006 | Riess et al. | |
| 7,240,271 B2 * | 7/2007 | Coles et al. | 714/752 |
| 7,292,652 B2 | 11/2007 | Luo et al. | |
| 7,765,441 B2 | 7/2010 | Peeters et al. | |
| 8,065,584 B2 * | 11/2011 | Coles et al. | 714/752 |
| 2001/0001151 A1 | 5/2001 | Duckwall et al. | |
| 2001/0019561 A1 | 9/2001 | Staats | |
| 2001/0024423 A1 | 9/2001 | Duckwall et al. | |
| 2002/0057655 A1 | 5/2002 | Staats | |
| 2002/0085581 A1 | 7/2002 | Hauck et al. | |
| 2002/0101231 A1 | 8/2002 | Staats | |
| 2002/0103947 A1 | 8/2002 | Duckwall et al. | |
| 2002/0188780 A1 | 12/2002 | Duckwall | |

(56) References Cited

U.S. PATENT DOCUMENTS

| | | |
|---|---|---|
| 2002/0188783 A1 | 12/2002 | Duckwall et al. |
| 2003/0037161 A1 | 2/2003 | Duckwall et al. |
| 2003/0055999 A1 | 3/2003 | Duckwall et al. |

OTHER PUBLICATIONS

"Information technology—Microprocessor systems—Control and Status Registers (CSR) Architecture for microcomputer buses", ANSI/IEEE Standard 1212, The Institute of Electrical and Electronics Engineers, Inc. pp. 1-122, 1994 Edition.

Bregni et al., Jitter Testing Technique and Results at VC-4 Desynchronizer Output of SDH Equipment, IEEE Transactions on Instrumentation and Measurement, vol. 44, Issue 3, pp. 675-678, Jun. 1995.

"IEEE Standard for a High Performance Serial Bus", IEEE Standard 1394-1995, Institute of Electrical and Electronics Engineers, Inc., pp. 1-384, approved Jul. 22, 1996.

Shiwen et al., Parallel Positive Justification in SDH C.sub.--4 Mapping, IEEE International Conference on Communications, vol. 3, pp. 157-158, Jun. 12, 1997.

"AV/C Digital Interface Command Set General Specification, Rev. 3.0", 1394 Trade Association, pp. 4-5, 20-34, Apr. 15, 1998.

"Enhancements to the AV/C General Specification 3.0 Version 1.0FC1", 1394 Trade Association, pp. 4, 6-17, Nov. 5, 1998.

"Information Technology—Fibre Channel—Methodologies for Jitter Specification", NCITS TR-25/1999, Jitter Working Group Technical Report, Rev. 10, pp. 1-96, Jun. 9, 1999.

P1394a Draft Standard for a High Performance Serial Bus (Supplement), Draft 3.0, Institute of Electrical and Electronics Engineers, Inc., pp. 1-187, Jun. 30, 1999.

"IEEE Standard for a High Performance Serial Bus—Amendment 1", Institute of Electrical and Electronics Engineers, Inc., pp. 1-196, approved Mar, 30, 2000.

P1394b IEEE Draft Standard for a High Performance Serial Bus (High Speed Supplement) P1394b Draft 1.3.3, Institute of Electrical and Electronics Engineers, Inc., pp. 1-408, Nov. 16, 2001.

"IEEE Standard for a High Performance Serial Bus—Amendment 2", Institute of Electrical and Electronics Engineers, Inc., pp. 1-369, 2002 (no month).

\* cited by examiner

SYMBOL ENCODING FOR TOLERANCE TO SINGLE BYTE ERRORS

This application is a divisional of and claims priority to co-owned and co-pending U.S. patent application Ser. No. 13/175,372 entitled "SYMBOL ENCODING FOR TOLERANCE TO SINGLE BYTE ERRORS" filed Jul. 1, 2011 (issuing as U.S. Pat. No. 8,321,748), which is a divisional of co-owned U.S. patent application Ser. No. 12/869,600 entitled "Symbol Encoding For Tolerance to Single Byte Errors" (now U.S. Pat. No. 7,975,201), which is a continuation of and claims priority to U.S. patent application Ser. No. 10/735,260 entitled "Symbol Encoding For Tolerance to Single Byte Errors" filed Dec. 11, 2003 (now U.S. Pat. No. 7,788,567), which claims priority to Provisional U.S. Patent Application Ser. No. 60/523,525 entitled "Symbol Encoding For Tolerance to Single Byte Errors" filed Nov. 18, 2003.

BACKGROUND

A "bus" is a collection of signals interconnecting two or more electrical devices that permits one device to transmit information to one or more other devices. There are many different types of buses used in computers and computer-related products. Examples include the Peripheral Component Interconnect ("PCI") bus, the Industry Standard Architecture ("ISA") bus and the Universal Serial Bus ("USB"), to name a few. Bus operation is usually defined by a standard that specifies various concerns such as the electrical characteristics of the bus, how data is to be transmitted over the bus, how requests for data are acknowledged, and the like. Using a bus to perform an activity, such as transmitting data, requesting data, etc., is generally called running a "cycle." Standardizing a bus protocol helps to ensure effective communication between devices connected to the bus, even if such devices are made by different manufacturers. Any company wishing to make and sell a device to be used on a particular bus, provides that device with an interface unique to the bus to which the device will connect. Designing a device to particular bus standard ensures that Thus, for example, an internal fax/modem (i.e., internal to a personal computer) designed for operation on a PCI bus will be able to transmit and receive data to and from other devices on the PCI bus, even if each device on the PCI bus is made by a different manufacturer.

According to most bus protocols, a device that needs to run a cycle on the bus must first gain control of the bus. Once the sending device has control of the bus, that device then can run its desired cycle, which may entail transmitting data to a receiving bus device. Often, more than one bus device may concurrently need to initiate a cycle on the bus. Bus protocols in which multiple devices may request control of the bus to run cycles usually implement some form of arbitration to efficiently decide which device to grant control of the bus among multiple devices requesting control. The prior art is replete with many types of arbitration schemes.

Currently, there is a market push to incorporate various types of consumer electronic equipment with a bus interface that permits such equipment to be connected to other equipment with a corresponding bus interface. For example, digital cameras, digital video recorders, digital video disks ("DVDs"), printers are becoming available with an IEEE 1394 bus interface. The IEEE ("Institute of Electrical and Electronics Engineers") 1394 serial interface (and all its variations, referred to collectively herein as "1394" unless otherwise noted) describes a bus that permits a digital camera to be connected to a printer or computer so that an image acquired by the camera can be printed on the printer or stored electronically in the computer. Further, digital televisions can be coupled to a computer or computer network via an IEEE 1394 standard-compliant bus.

Current solutions for encoding IEEE 1394 standard-compliant data, arbitration states and control states onto 10-bit symbols for use in IEEE 1394c standard-compliant (aka T_mode) data transmission are not robust to byte errors which may occur when IEEE 802.3 Clause 40-compliant PRY encoding is used to transport 1394 protocols. In particular, a single byte error in the 802.3 Clause 40 encoding may result in two errored 10-bit symbols at the 1394 level. This is particularly of concern should the two symbols be a pair of 1394 control symbols, such as used to separate data from arbitration requests.

The IEEE 1394b standard alternates arbitration request signaling and packet transmission. Packet transmission commences with the transmission of specific control symbols indicating packet prefix, and terminates with further specific control symbols. All symbols are encoded as 10-bit values. Data symbols and control symbols in accordance with the 1394b format are as follows. ARB is a data symbol representing an arbitration request, SP is a SPEED control symbol which introduces a packet and indicates its speed, DP is a DATA_PREFIX control symbol which introduces a packet, D is a data symbol representing packet payload, and DE is a DATA_END control symbol which terminates a packet. For robustness against single bit errors, control symbols are typically sent twice, or at least a packet is introduced by a pair of control symbols, both of which set the "in packet" context.

In 1394b Beta mode, all symbols are encoded as 10-bit symbols using an extension of the IBM 8B 10B code definition. Both arbitration signals and data signals use 8B 10B data values. 1394b encoding requires that the "in-packet" context be maintained in order to distinguish between a data symbol used as packet payload and a data symbol used as an arbitration request symbol. The "in-packet" context is set by the SPEED and DATA_PREFIX control symbols, and reset by control symbols such as DATA_END, GRANT, ARB_CONTEXT, all of which terminate a packet. DATA_PREFIX may also be used to separate packets—terminating one packet and immediately introducing a second packet.

In 1394b Beta mode, signaling uses NRZ encoding, which is electrically specified to have a bit error rate of less than 1 error in 1012 bits. The (extended) 8B10B encoding will always detect a single-bit error in a control symbol, and will detect a single-bit error in a data symbol either immediately or shortly afterwards due to a running disparity failure. If a bit error occurs in an arbitration symbol, this is relatively harmless as the error will be corrected in the succeeding arbitration symbol. The 1394b arbitration mechanisms are also robust against dropped or erroneous arbitration symbols—in general the result will be no worse that "unfairness" or a dropped isochronous packet, and usually totally benign. If a bit error occurs in the packet data payload, then this will be caught by packet checksums, and a retry made (where appropriate).

In an embodiment, the format of the present invention uses double instances of control symbols at all times, in particular at the start and end of packets, to provide a measure of robustness against a bit error occurring within a control symbol. The chance of two errors occurring in two consecutive control symbols in an otherwise relatively reliable connection is considered remote.

In order to preserve and reuse the functionality and timing properties of the 1394b arbitration protocols, 1394e requires a one-to-one correspondence between 1394b 10-bit symbols transmitted/received at S800 and 1394c symbols, both in functionality and in duration. Thus each 1394c symbol must have a 10-bit representation at a nominal transmission rate of 983.04 Mbit/sec. However, the 1394c representation of the symbols can be different from that of 1394b. It was recognized that 1394b scrambling provides no advantage, nor does the robustness to single-bit errors provided by 8B 10B encoding, when using IEEE 802.3 Clause 40 signaling. Both of these are due to the properties of the lower level transmission specified the IEEE 802.3 Clause 40 signaling. Thus, 1394c simplifies the 1394b encoding by deleting the use of scrambling and 8B10B encoding. This preserves functionality and timing.

In 1394c T_mode, the symbols are currently encoded as follows. Two type bits are followed by eight symbol bits. Arbitration requests and control symbols are encoded identically to 1394b before 8B10B encoding. The two type bits indicate a data value if both type bits are set to zero; an arbitration request if the first type bit is set to zero and the second type bit is set to one; and a control symbol if the first type bit is set to one and the second type bit is set to zero. However, this encoding lacks robustness, particularly to the anticipated failure modes of the 802 Clause 40 signaling. A transmission failure when using 802.3 Clause 40 signaling results typically in a single byte error or in a burst of consecutive byte errors. Thus an encoding which provides robustness only to single bit en-ors is considered inadequate. However, the 802.3 Clause 40 signaling layer detects and reports such byte errors, so it is not necessary to implement an additional error detection mechanism.

The resulting 10-bit symbol stream is then transmitted as a stream of 802.3 Clause 40 standard-compliant 8-bit bytes, on a "five-to-four" basis—i.e. five 8-bit bytes transmitted for every four 10-bit 1394c symbols, as illustrated in FIG. 1. However, the electrical signaling used for transmission of 802.3 Clause 40 standard-compliant bytes may result in an errored byte. In an errored byte, all eight bits are unreliable. The immediate problem that this causes is that a single 802.3 Clause 40 error will result, in some cases, in two consecutive 1394e standard-compliant symbols being in error.

For example, as shown in FIG. 1, an error in byte a will result in symbol A being errored, and an error in byte e will result in symbol D being errored. But an error in byte b results in both symbols A and B being errored. An error in byte c results in both symbols B and C being errored. An error in byte d results in symbols C and D being errored. Thus there is a 60% chance of a single 802.3 Clause 40 error affecting two consecutive symbols.

Depending on where in the data stream the original error occurs, there is a significant possibility that the two errored 1394e standard-compliant symbols are the two consecutive control symbols that either introduce or terminate a packet. This problem can seriously degrade data transmission. Thus, there is a heartfelt need for a more robust encoding.

SUMMARY

The present invention provides encoding that has the property that a single 802.3 Clause 40 byte error cannot result in two consecutive 1394 control symbols being errored. It also adds features to assist robustness in the case of errored arbitration requests, and robustness in the case of bursts of byte errors.

In an embodiment, the present invention provides a method of transmitting data across a network to a receiving side, the network using a transmission implementation, the method comprising: if data to be transmitted can be encoded as groups of bits, each group having a first subgroup of critical information and a second subgroup of less critical information, and if the transmission implementation groups information into transmission quanta having equal numbers of bits and has the property that each transmission quantum can be reported on the receiving side as having been received correctly, or in which a transmission error is detected, then: encoding the data to be transmitted, the encoding replicating the critical information and separating the replicated, critical information by a number of bits from the second subgroup, the number of bits equal to at least one less than the number of bits in the transmission quantum; and Transmitting the encoded data over the network to the receiving side. The second subgroup may contain padding bits that adapt the first subgroup and second subgroup to have a total number of bits required by the transmission quantum. The second subgroup may contain a control field, the control field located within the second subgroup such that the control field is followed by the padding bits.

Figure 1:
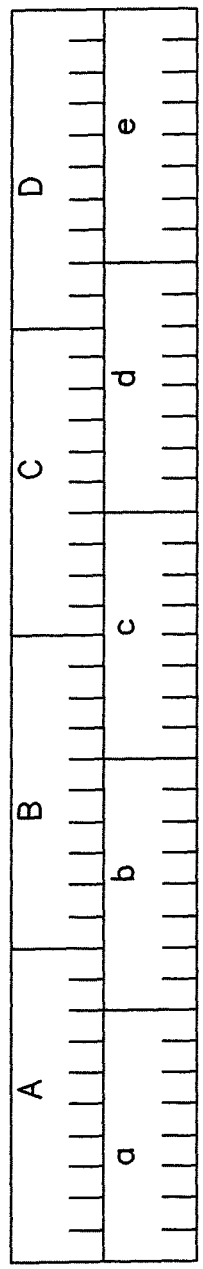
FIG. 1 is a logical representation of a prior art IEEE 1394c 10-bit symbol and a prior art IEEE 802.3ab 8-bit symbol.

In an embodiment, the second subgroup contains a control field located within the second subgroup such that the padding bits are followed by the control field. Critical information is represented by a pair of identical bits, each of which are separated by the second subgroup of bits. In another embodiment, the critical information is represented by two pluralities of bits that are identical to each other, and separated by the second subgroup of bits.

In another embodiment, the present invention provides a method of transmitting data across a network to a receiving side, the network using a transmission implementation, the method comprising: if data to be transmitted can be encoded as groups of bits, each group having a first subgroup of critical information and a second subgroup of less critical information, and if the transmission implementation groups information into transmission quanta having equal numbers of bits and has the property that each transmission quantum can be reported on the receiving side as having been received correctly, or in which a transmission error is detected, and if the groups of bits and the transmission quanta have sizes that are multiples of 2 and that a start of a transmission quantum always aligns with an even-encoded bit in a group of bits, then: encoding the data to be transmitted, the encoding replicating the critical information and separating the replicated, critical information by a number of bits from the second subgroup, the number of bits equal to at least two less than the number of bits in the transmission quantum; and transmitting the encoded data over the network to the receiving side.

In yet another embodiment, the present invention provides a method of processing data received over a network, the method comprising: receiving data encoded as groups of bits, each group having a first subgroup of critical information and a second subgroup of less critical information, each group of bits associated with a symbol, wherein the groups of bits are received in transmission quanta having equal numbers of bits, the groups of bits and the transmission quanta having sizes that are multiples of 2 and a start of a transmission quantum is aligned with an even-encoded bit in a group of bits, the encoding replicating the critical information and separating the replicated, critical information by a number of bits from the second subgroup, the number of bits equal to no less than two less than the number of bits in the transmission quantum; if an errored group of bits is received, and one of the replicated, critical information bits is evaluated to be of a first value, and transmission mode is not in in-packet mode, then replacing the symbol associated with the errored group of bits with a DATA_NULL symbol; and if an errored group of bits is received, and one of the replicated, critical information bits is evaluated to be of a first value, and transmission mode is in in-packet mode, then accepting as data the symbol associated with the errored group of bits.

DETAILED DESCRIPTION

Figure 2:
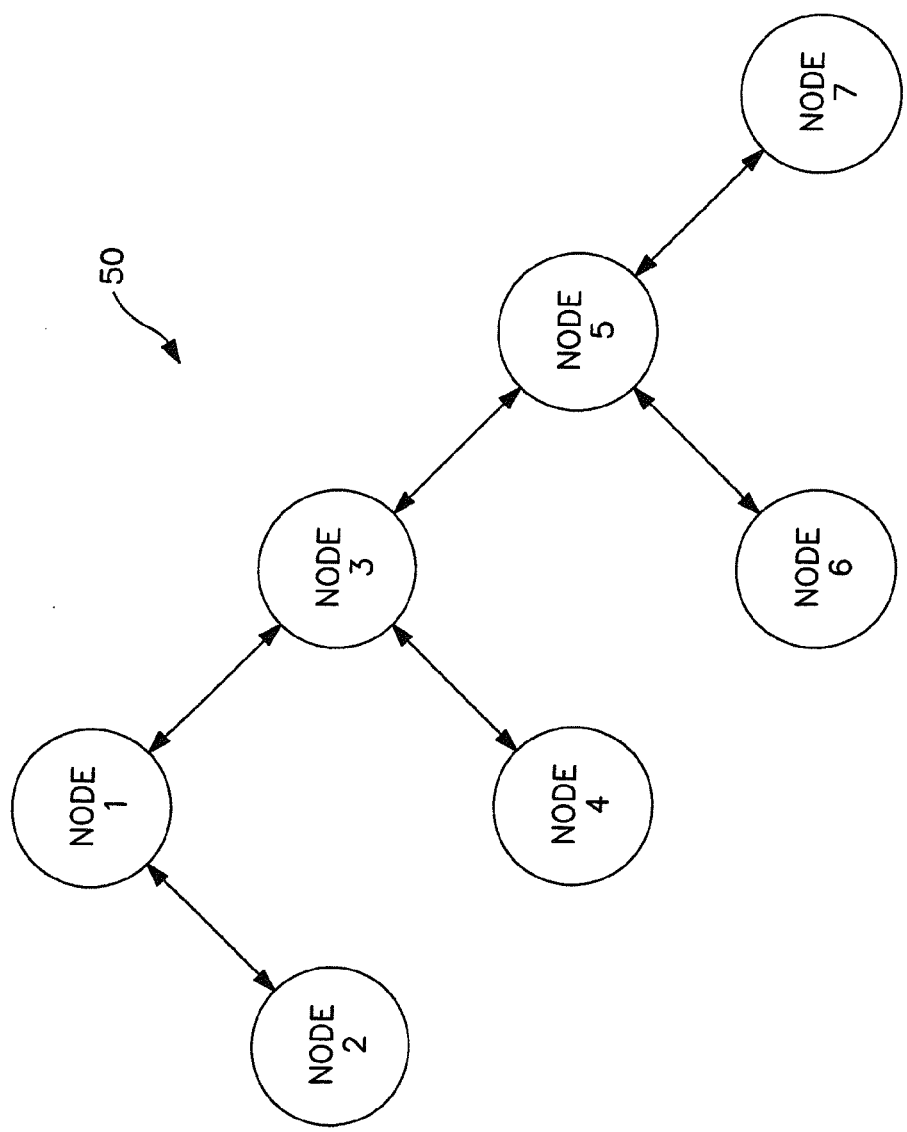
FIG. 2 is a logical representation of an exemplary IEEE 1394 network of nodes, useful in conjunction with various embodiments of the present disclosure.

To understand the nature of the problem solved by the present invention, the general structure and operation of an IEEE 1394 bus and arbitration scheme will now be provided. Referring to FIG. 2, an IEEE 1394 network 50 comprises one or more "nodes," node 1-node 7. A node represents an electronic device(s) with an IEEE 1394 bus interface. A node device may comprise a computer, a digital camera, a digital video recorder, a DVD player, or another type of device having a suitable bus interface. Each node couples to at least one other node. As shown in the exemplary architecture of FIG. 2, node 1 couples both to nodes 2 and 3. Node 3, in turn, couples to nodes 4, and 5 and node 5 also couples to nodes 6 and 7. In general, each node can transmit data to any other node in the network. For example, node 7 can transmit data to node 2, but the transmitted data will pass from node 7 to node 5 to node 3 to node 1 and then, to node 2.

Figure 3:
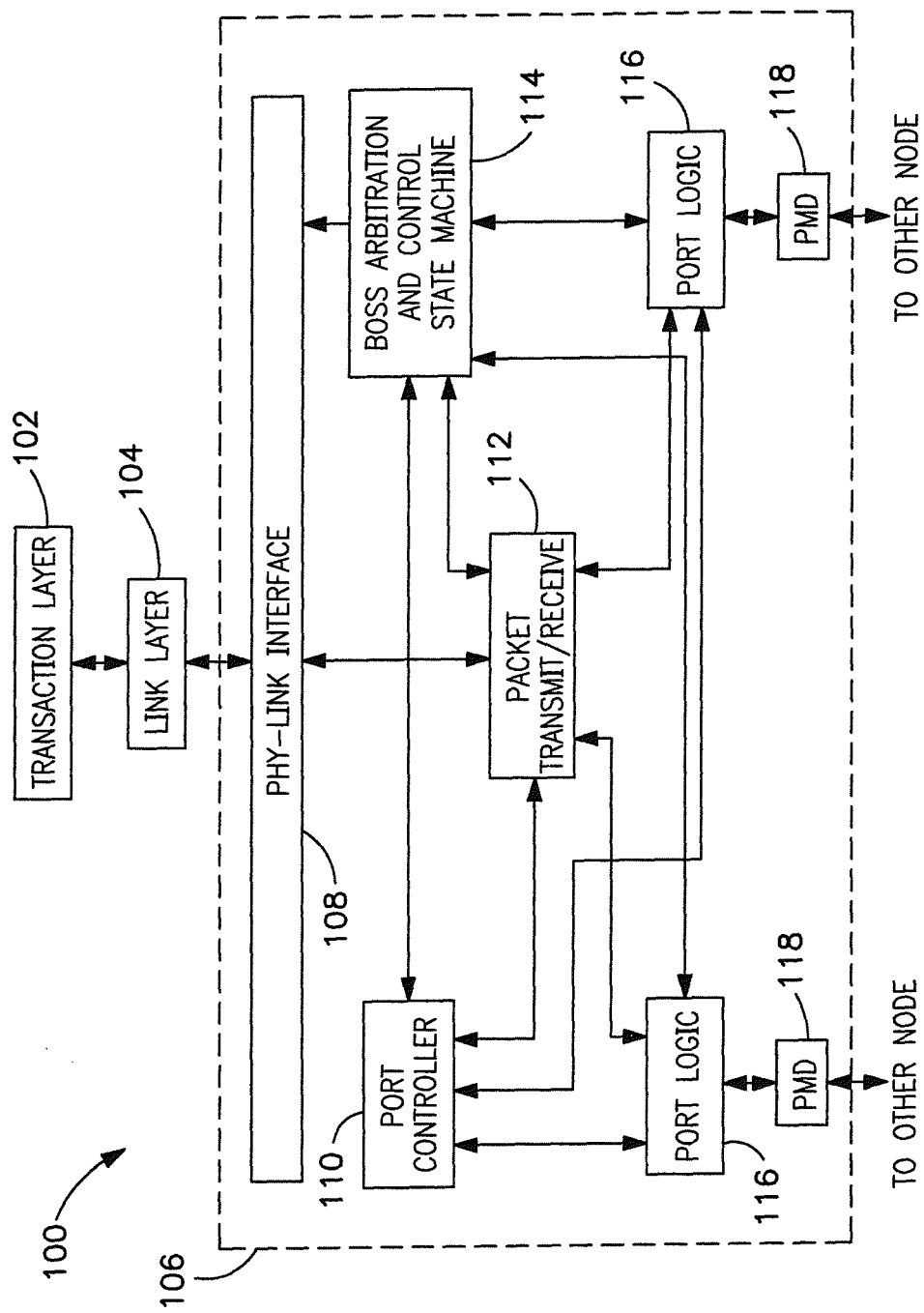
FIG. 3 is a logical block diagram of an exemplary IEEE 1394 node, useful in conjunction with various embodiments of the present disclosure.

Referring to FIG. 3, node 100 generally comprises three layers: transaction layer 102, link layer 104 and physical layer 106 (referred to as a "PHY 106"). Transaction layer 102 implements the request-response protocol required to conform to the IEEE 1394 standard in accordance with known techniques. Link layer 104 supplies an acknowledgment to the transaction layer. Link layer 104 handles all packet transmission and reception responsibilities as well as the provision of cycle control for isochronous channels. The PHY 106 generally provides the initialization and arbitration services necessary to assure that only one node at a time is sending data and to translate the serial bus data stream and signal levels to those required by the link layer logic 104. PHY 106 also implements the arbitration scheme of the preferred embodiment of the invention.

Referring still to FIG. 3, PRY 106 preferably includes PRY-Link interface 108, port controller 110, packet transmit/receive 112, BOSS arbitration and control state machine 114, one or more port logic units 116, and physical media dependent ("PMD") electronics unit 118 for each port 116. Each port 116 can be used to couple the nodes to another node in the network. Multiple ports can be included within each node. Although two ports 116 are shown in the preferred embodiment of FIG. 3, the number of ports is not important for the present invention. Each port 116 couples to a PMD 118 that provides the necessary electrical interface to the particular physical communications medium. The physical communications medium may include any suitable type of medium such as Cat. 5 UTP, glass optical fiber, plastic optical fiber, beta-only electrical, bilingual electrical or DS-only electrical types of communication media. Each port 116 and its associated PMD 118 can be connected via a communication medium to another node in the network.

Port controller 110 generally controls the interface to another node in the network. Packet transmit/receive 112 generally receives and forwards all data packets. Packet transmit/receive 112 includes logic (not shown) to effectively control the flow of data cycles through PRY 106. Any node in the network can request ownership of the network to be the BOSS by transmitting an appropriate request to all of the neighboring nodes to which the requesting node connects. As such, each node in the network can receive requests from its neighboring nodes to be the BOSS and each node itself can request ownership of the bus. BOSS arbitration and control state machine 114 within a node receives all of the requests from its neighboring nodes in the network, via the various port logic units 116 and PMDs 118, as well as its own request to be BOSS. BOSS arbitration and control state machine 114 then prioritizes these various requests and sends out the highest priority request to all neighboring nodes through all active ports 116 not currently being used to transmit data. Eventually, the requests propagate their way to the current BOSS who grants ownership of the bus to the highest priority requests.

1394c adds a new type of PMD 118 to those specified in prior 1394 standards. This new type of PMD 118 uses the electrical signaling specified in IEEE 802.3 Clause 40 to transmit information at 1000 Mbit/sec. 1394c also specifices the Port Logic 116 specific to this PMD 118, while retaining the other components of node 100 as specified in prior 1394 standards.

One feature of the 802.3 Clause 40 signaling scheme described above is that errored bytes are flagged as such. Thus one element of robustness provided by embodiments of the present invention can take advantage of this feature, and the receiving port can take special action on receipt of an errored byte.

Embodiments of the present invention can be incorporated into logic contained on PHY 106, or elsewhere as needed. Embodiments of the present invention can utilize computer program products in the form of software or hardware.

Figure 4:
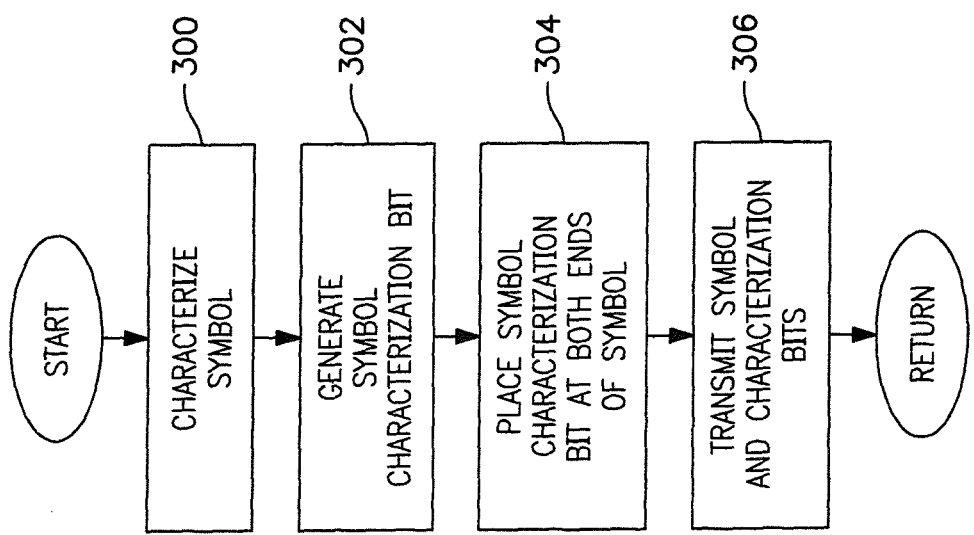
FIG. 4 is a logical flow diagram of one generalized method for protecting symbol types, in accordance with various principles of the present disclosure.

Directing attention to FIG. 4, an embodiment of the present invention provides a method that protects symbol types by characterizing symbols (act 300) as one of two types—DATA or NON_DATA, generating a symbol characterization bit (act 302), placing the symbol characterization bit at both ends of the symbol (act 304), and transmitting the symbol with the symbol characterization bits at both ends (act 306). Thus, a single byte error may affect a type bit in two consecutive symbols, and will affect one or the other of the type bits in a single symbol, but cannot affect both type bits in a single symbol. Having protected the symbol type, encoding in accordance with the present invention protects at least one of a pair of control symbols by using alternate encodings for symbols in positions A and B and for symbols in position C and D as well.

An embodiment of the present invention utilizes control symbol values specified in the 1394b standard. Thus, a control symbol can be distinguished from a request Symbol, and a full decode provided, in five bits.

In the case of symbols A and B, the control encoding can be distinguished from request encoding and be completely determined from the more significant five bits after the most significant type bit, and in the case of C and D, from the less significant five bits before the less significant type bit. Similarly, the encoding in accordance with the present invention protects the distinction between control symbols and arbitration requests by generating a bit that distinguishes between control symbols and arbitration request symbols, and placing the generated bit at both ends of the sub-symbol.

Figure 5:
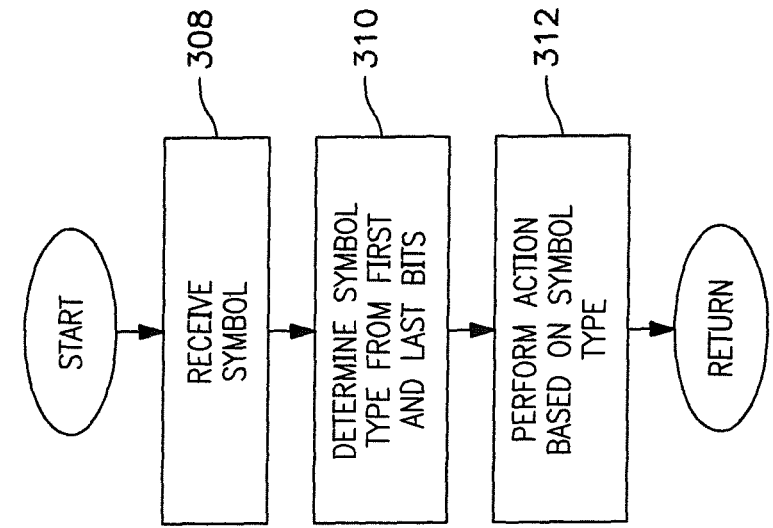
FIG. 5 is a logical flow diagram of one generalized method for receiving symbols, in accordance with various principles of the present disclosure.

Directing attention to FIG. 5, on the receiving side, the present invention provides a method wherein a symbol is received (act 308), a symbol type is determined by reading the first and last bits of the received symbol (act 310) and action is performed based on the symbol type, in accordance with the rules specified in tables 1 & 2.

Encoding in accordance with the present invention provides increased robustness from knowledge of whether the symbol is a control symbol or an arbitration request, even though the particular control or request information may have been lost. Thus in case of errored byte a, symbol A is lost. In the case of errored byte b, symbol B is lost, but symbol A is still decoded correctly if symbol A is a control symbol. In the case of errored byte c, both symbols B and C are still decoded correctly if they are control symbols. In the case of errored byte d, symbol C is lost and symbol D is decoded correctly if both symbols C and D are control symbols. In the case of errored byte e, symbol D is lost.

Robustness is provided in embodiments of the present invention because a PRY is able to distinguish whether a lost symbol is a data symbol, a control symbol or an arbitration request, based on the encoding of the lost symbol. Encoding in accordance with the present invention also provides an arbitration request to be received correctly despite the symbol being affected by an errored byte in some situations.

The present invention provides an encoding where symbol type bits are represented by the letter, "T," and symbol bits are represented by the letter, "S." In an embodiment, packets transmitted in accordance with the present invention appear in the following format:

|T0|S1|S2|S3|S4|S5|S6|S7|S8|T9|     (1)

Thus, a first instance of a type bit is followed by eight symbol bits, which are followed by a second instance of the same type bit.

In another embodiment, symbol key bits can be defined from the eight symbol bits. This is especially useful for 8-bit encoding rather than 10-bit encoding. In such embodiments, transmission and reception of encoding following au 8-bit encoding scheme using symbol key bits can follow generally the steps illustrated in FIGS. 4 and 5. A first instance of a symbol key bit S(K) is followed by six symbol bits, which are followed by a second instance of the same symbol key bit:

|S(K)1|S2|S3|S4|S5|S6|S7|S(K)8|     (2)

Symbol key bits can also be used to enhance 10-bit encoding schemes using formats such as (1), where bits S1 and S8 are symbol key bits that provide additional information about the symbol described by symbol bits S2 through S7.

The following explanation of the present invention makes references to the IEEE 1394b serial bus standard.

In an embodiment, the symbol encoding for data bytes is distinguished from control symbols or arbitration requests by setting T0/T9=0, and S1 thru S8 to hold the value of the data byte. In this embodiment, no special use is made of the symbol key bits S1/S8.

In an another embodiment, the symbol encoding for control symbols and arbitration requests is distinguished from data bytes by setting T0/T9=1. In turn, control symbols are distinguished from arbitration requests by setting S1/S8 to 0 for arbitration requests and to 1 for control symbols.

An S-bit byte may be defined in accordance with the present invention as follows. A byte having the characters, 0aaaiii0 (i.e. with S1/S8=0), can indicate an arbitration request, with aaa set as per bits ABC in 1394b Tables 13-2, 13-4 and 13-5, iii set as per bits DEH in 1394b Tables 13-3, 13-4 and 13-5. In an embodiment, symbol encoding for control symbols when S1/SS=1, for symbol positions A and B, appears as "1cccc001." This identifies the symbol as a control symbol, with cccc set as per bits PQRS in 1394b Table 13-1. Symbol positions C and D in control symbols when T0/T9=1, in an embodiment of the present invention, may appear as "100 ccccl," with cccc set as per bits PQRS in 1394b Table 13-1.

Figure 6:
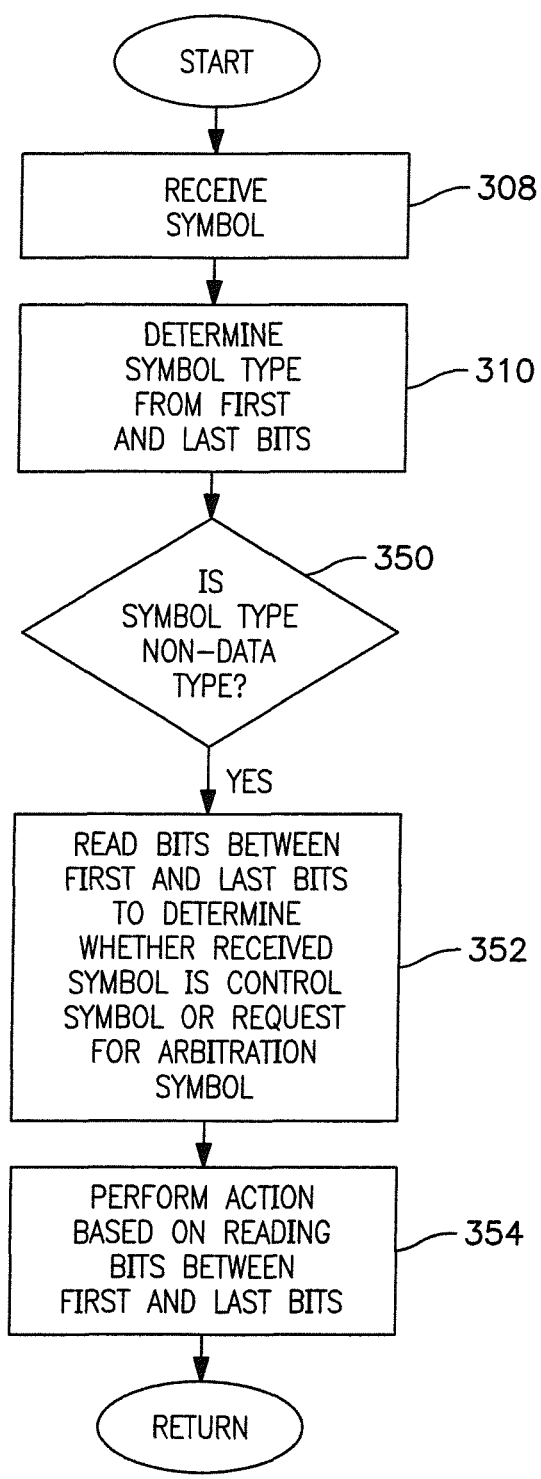
FIG. 6 is a logical flow diagram of one exemplary method for receiving symbols which is further enhanced to determine the received symbol type, in accordance with various principles of the present disclosure.

In another embodiment of the present invention (FIG. 6), the method of FIG. 5 is enhanced to include determining that the received symbol is of the type NON-DATA (act 350). Bits between the symbol characterization bits are read to determine whether the received symbol is a control symbol or a request for arbitration symbol (act 352). In an embodiment, this determination can be made from reading symbol key bits S(K)1 and S(K)S. Action is then performed in accordance with the rules described in tables 1 & 2 (act 354), based on the values of the bits contained in the received symbol.

Figure 7:
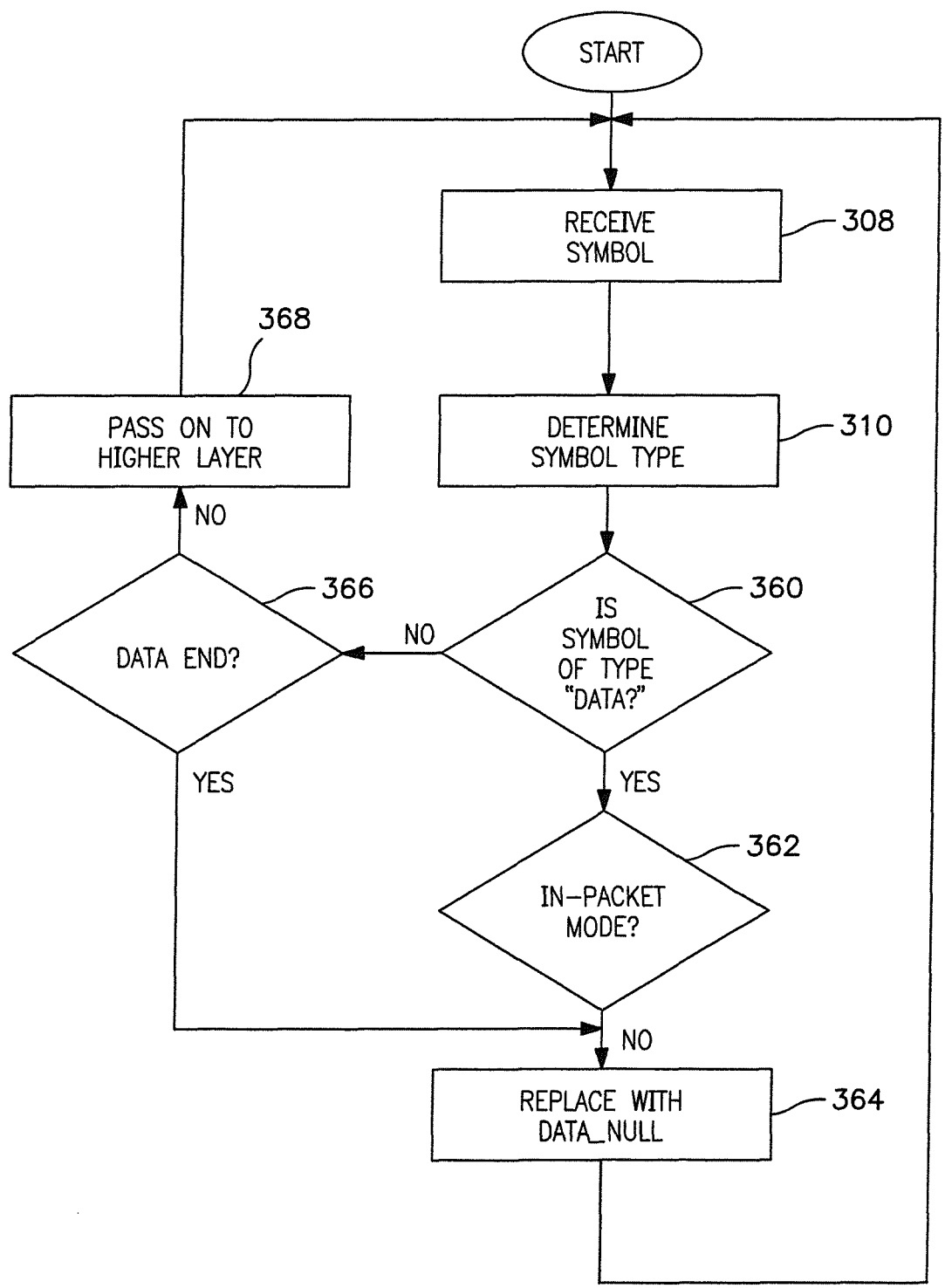
FIG. 7 is a logical flow diagram of one exemplary method for handling data which is of a "DATA" type, in accordance with various principles of the present disclosure.

Directing attention to FIG. 7, an enhanced method in accordance with an embodiment of the present invention makes a determination that the received symbol is of the type DATA (act 360). If a determination is made that the symbol was received when symbol reception is not being performed in in-packet context (act 362), then this implies that previous errors prevented the start of the packet from being detected. The received symbol is then replaced with a DATA_NULL symbol (act 364), and control returns to act 308. Thus, all succeeding DATA symbols are also replaced with DATA_NULL symbols. Eventually, the packet will be terminated by either a DATA_END symbol or a GRANT symbol or a DATA_PREFIX symbol, or a ARB_CONTEXT symbol, or, abnormally, by an arbitration request. The DATA_END symbol, if detected immediately following a DATA symbol (act 366), is also replaced by a DATA_NULL symbol. This is done to remove ambiguity which might otherwise occur in the 1394b arbitration state machine. Normally, DATA_END is repeated by the arbitration state machine at the packet speed. But in this scenario, the packet speed is unknown. Thus additional robustness is introduced by suppressing the DATA_END symbols at the end of the packet. All other symbols following a DATA symbols and all subsequent symbols are processed normally by being passed on to higher layers (act 368).

Figure 8:
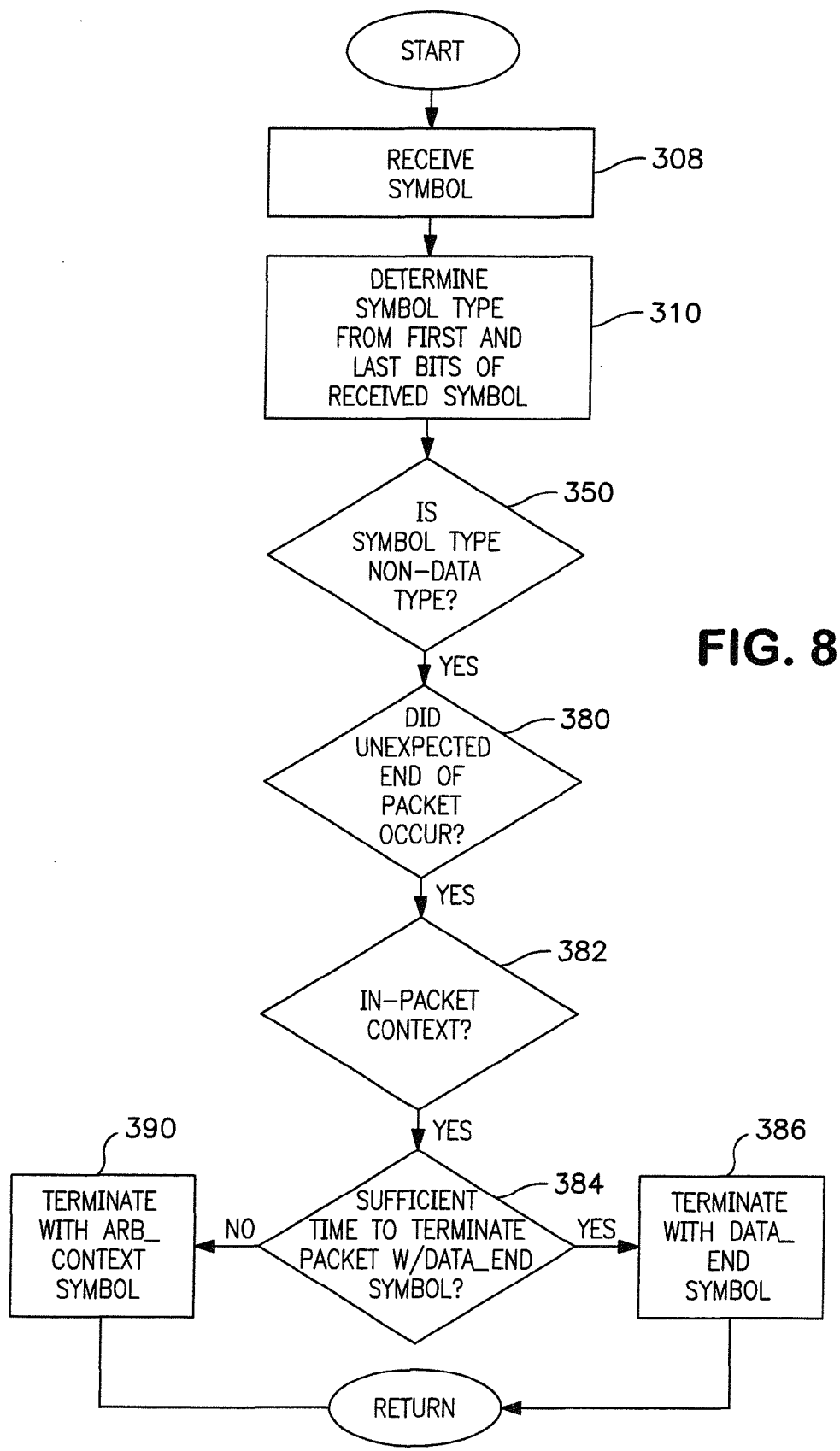
FIG. 8 is a logical flow diagram of one exemplary method for handling data which is of a "NON-DATA" type, in accordance with various principles of the present disclosure.

In another embodiment (FIG. 8), if (act 380) an unexpected end of packet occurs (for example, on the reception of a sudden IDLE or an arbitration request) when in in-packet context (act 382), then if sufficient time is available (act 384) the arbitration state machine terminates the packet with DATA_END (act 386), otherwise it terminates the packet with an ARB_CONTEXT control symbol (act 390). This provides robustness against dropped end of packet control symbols. While a distinction is made in 1394b between pkt_prefix and pkt, both of these cases are represented herein as "in packet."

Tables 1-2 show a plurality of symbol decode rules. Symbol position denotes the relevant symbol(s) as illustrated in FIG. 1 for 1394c 10-bit symbol. Errored byte(s) indicates the corresponding 802.3 Clause 40 byte(s) (also shown in FIG. 3) that are in error. T0 and T9 indicate values for characterization bits appearing at the end of the transmitted or received symbol, that indicate the type of symbol as either DATA or NON-DATA. S1 and S8 indicate values for beginning and ending bits of the symbol referred to above as the symbol key bits that appear between characterization bits T0 and T9. In-packet indicates whether reception of symbols is determined as being in in-packet mode or not. The result column contains the associated actions(s) that are taken when values of the adjacent columns are evaluated as indicated in the row. Y indicates a positive evaluation, N indicates a negative evaluation, and X indicates that evaluation is irrelevant (the rule applies for all possible evaluations). It is to be understood that the tables below are not necessarily inclusive of all possible symbol decode rules, and others may be inferred from existing symbol decode rules in the tables and functionality of the various embodiments of the present invention.

TABLE 1

Symbol decode rules

| Symbol position | Errored byte(s) | T0 | T9 | S1 | S8 | In packet? | Action |
|---|---|---|---|---|---|---|---|
| ABCD | (none) | 0 | 0 | X | x | N | Replace with DATA_NULL |
| ABCD | (none) | 0 | 0 | X | x | Y | Accept as data |
| ABCD | (none) | Opposite values | | X | x | x | Ignore, increment invalid count |
| ABCD | (none) | 1 | 1 | 0 | 0 | N | Accept arbitration request |
| ABCD | (none) | 1 | 1 | 0 | 0 | Y | Accept arbitration request if valid (missed packet ending) and clear "in packet," otherwise ignore and increment invalid count |
| ABCD | (none) | 1 | 1 | Opposite Value | | x | Errored arbitration or control request, ignore and increment invalid count |
| ABCD | (none) | 1 | 1 | 1 | 1 | N | If invalid control symbol, ignore and increment invalid count. Set "in packet" if DATA_PREFIX, SPEEDa or SPEEDb. Replace DATA_END by DATA_NULL. |
| ABCD | (none) | 1 | 1 | 1 | 1 | Y | If invalid control symbol, ignore and increment invalid count. Clear "in packet" unless DATA_PREFIX, SPEEDa, SPEEDb or SPEEDc or DATA_END. |

TABLE 2

Symbol decode rules

| Symbol position | Errored byte(s) | T0 | T9 | S1 | S8 | In packet? | Action |
|---|---|---|---|---|---|---|---|
| A | a | x | 0 | x | x | Y | Accept as data. |
| A | a | x | 0 | X | x | N | Replace with DATA_NULL |
| A | a | x | 1 | X | 0 | N | Ignore |
| A | a | x | 1 | X | 0 | Y | Ignore, clear "in packet" |
| A | a | x | 1 | X | 1 | x | Ignore |
| A | ab | x | x | X | x | x | Ignore |
| A | b | 0 | x | X | x | N | Replace with DATA_NULL |
| A | b | 0 | x | X | x | Y | Accept as data |
| A | b | 1 | x | 0 | x | N | Accept as arbitration request |
| A | b | 1 | x | 0 | x | Y | Accept as arbitration request, clear "in packet" |
| A | b | 1 | x | 1 | x | N | Accept (as per ABCD control symbol above) |
| A | b | 1 | x | 1 | x | Y | Accept (as per ABCD control symbol above) |
| B | b | x | 0 | X | x | N | Replace with DATA_NULL |
| B | b | x | 0 | X | x | Y | Accept as data |
| B | b | x | 1 | X | 0 | N | Ignore |
| B | b | x | 1 | X | 0 | Y | Ignore, clear "in packet" |
| B | b | x | 1 | X | 1 | x | Ignore |
| B | bc | x | x | X | x | x | Ignore |
| B | c | 0 | x | X | x | N | Replace with DATA_NULL |
| B | c | 0 | x | X | x | Y | Accept as data |
| B | c | 1 | x | 0 | x | N | Ignore |
| B | c | 1 | x | 0 | x | Y | Ignore, clear "in packet" |
| B | c | 1 | x | 1 | x | N | Accept (as per ABCD control symbol above, but interpreting the control value purely on S2-S5). |
| B | c | 1 | x | 1 | x | Y | Accept (as per ABCD control symbol above, but interpreting the control value purely on S2-S5). |
| C | c | x | 0 | X | x | N | Replace with DATA_NULL |
| C | c | x | 0 | X | x | Y | Accept as data |
| C | c | x | 1 | X | 0 | N | Ignore |

TABLE 2-continued

Symbol decode rules

| Symbol position | Errored byte(s) | T0 | T9 | S1 | S8 | In packet? | Action |
|---|---|---|---|---|---|---|---|
| C | c | x | 1 | X | 0 | Y | Ignore, clear "in packet" |
| C | c | x | 1 | X | 1 | N | Accept (as per ABCD control symbol above, but interpreting the control value purely on S4-S7) |
| C | c | x | 1 | X | 1 | Y | Accept (as per ABCD control symbol above, but interpreting the control value purely on S4-S7) |
| C | cd | x | x | X | x | x | Ignore |
| C | d | 0 | x | X | x | N | Replace with DATA_NULL |
| C | d | 0 | x | X | x | Y | Accept as data |
| C | d | 1 | x | 0 | x | N | Ignore |
| C | d | 1 | x | 0 | x | Y | Ignore, clear "in packet" |
| C | d | 1 | x | 1 | x | x | Ignore |
| D | d | x | 0 | X | x | N | Replace with DATA_NULL |
| D | d | x | 0 | X | x | Y | Accept as data |
| D | d | x | 1 | X | 0 | N | Accept as arbitration request |
| D | d | x | 1 | X | 0 | Y | Accept as arbitration request, clear "in packet" |
| D | d | x | 1 | X | 1 | N | Process (as per ABCD control symbol above) |
| D | d | x | 1 | X | 1 | Y | Process (as per ABCD control symbol above) |
| D | de | x | x | x | x | x | Ignore |
| D | e | 0 | x | x | x | N | Replace with DATA_NULL |
| D | e | 0 | x | x | x | Y | Accept as data |
| D | e | 1 | x | 0 | x | N | Ignore |
| D | e | 1 | x | 0 | x | Y | Ignore, clear "in packet" |
| D | e | 1 | x | 1 | x | x | Ignore |

If a received control symbol or arbitration request can be fully decoded according to the rules shown in Tables 1-2 above, and is specified in Tables 1-2 as "Accepted," but does not correspond to a valid symbol or arbitration request, then it is ignored and the invalid count is incremented. In some cases this is due to receipt of an errored byte or burst of bytes. Other actions noted in Tables 1-N are still taken.

As 802.3 Clause 40 errors may well occur in bursts of multiple bytes, the invalid count is incremented on the first error in a burst of 64 bytes or less. The invalid count is incremented for every 64 bytes errored in a burst. The port also maintains a register of the maximum errored byte burst length.

While symbol encoding for tolerance to single byte errors has been illustrated and described in detail, it is to be understood that many variations can be made to embodiments of the present invention without departing from the spirit of the invention.

What is claimed is:

1. An apparatus comprising:
a processor; and
a non-transitory computer readable medium comprising one or more instructions, the instructions configured to, when executed by the processor, cause the apparatus to:
generate data based at least in part on a portion of a first symbol and a portion of a second symbol, wherein the portion of the first symbol is indicative of a first symbol type and the portion of the second symbol is indicative of a second symbol type; and
determine when the generated data is corrupted, and when the generated data is corrupted:
determine if the first symbol is valid, based at least in part on the first symbol type; and
determine if the second symbol is valid, based at least in part on the second symbol type.

2. The apparatus of claim 1, wherein each of the first and second symbols has multiple portions indicative of symbol type.

3. The apparatus of claim 2, wherein the multiple portions are at opposite ends of each symbol.

4. The apparatus of claim 1, additionally comprising logic configured to correct corrupted data if at least one of the first and second symbols is determined to be valid.

5. The apparatus of claim 4, wherein the correction of corrupted data comprises replacement of the corrupted data if at least one of the first and second symbols is determined not to be valid.

6. A method of recovering received data, the method comprising:
recovering a first symbol and second symbol from a plurality of bytes, where the first symbol spans a first byte and a second byte, and where the second symbol spans the second byte and a third byte;
identifying a symbol type for each of the first recovered symbol, and the second recovered symbol;
detecting that one or more bytes of the recovered first symbol and second symbol are corrupted; and
restoring at least one of the first and second symbols based on the identified symbol types.

7. The method of claim 6, wherein the first, second, and third bytes are consecutively ordered.

8. The method of claim 7, wherein the first and second symbols are consecutively ordered.

9. The method of claim 6, wherein the symbol types of the recovered first and second symbol are identified using at least a first bit and/or last bit of the first and second recovered symbols, respectively.

10. The method of claim 6, wherein the restoring of at least one of the first and second symbols comprises decoding the one or more bytes of corrupted data when at least one of the first or second symbols are not valid.

11. The method of claim 10, wherein the restoring of at least one of the first and second symbols comprises replacing the one or more bytes of corrupted data when at least one of the first or second symbols are not valid.

12. The method of claim 6, wherein the first and second symbols each comprise at least multiple data portions indicative of a symbol type.

13. An apparatus comprising:
a processor; and
logic in data communication with the processor, the logic configured to:
recover a first symbol and second symbol from a plurality of bytes;
identify first and second symbol types for the first and second recovered symbols, respectively;
determine that one or more bytes of the first and second symbols are corrupted; and
restore at least one of the first and second symbols based on the identified first and second symbol types.

14. The apparatus of claim 13, wherein the first and second symbol types are determined via one or more bit portions of the recovered first and second symbols, respectively.

15. The apparatus of claim 14, wherein the content of the one or more bit portions used to identify the first and second symbol types are repeated at the beginning and end of the first and second recovered symbols, respectively.

16. The apparatus of claim 13, wherein the logic is further configured to determine that the first and second recovered symbols are valid symbols based at least in part on the identified symbol types.

17. The apparatus of claim 16, wherein the logic configured to restore at least one of the first and second symbols is further configured to replace the one or more bytes of corrupted data when at least one of the first or second symbols are invalid.

18. The apparatus of claim 16, wherein the logic configured to restore at least one of the first and second symbols is further configured to decode the one or more bytes of corrupted data when at least one of the first or second symbols are not valid.

19. The apparatus of claim 13, wherein:
the first symbol spans at least a portion of a first byte and at least a portion of a second byte; and
the second symbol includes at least a portion of the second byte and at least a portion of a third byte.

20. The apparatus of claim 19, wherein the first and second symbols are consecutively ordered.

21. The apparatus of claim 13, wherein the first and second symbol types comprise the same symbol type.

* * * * *